United States Patent
Lee

(10) Patent No.: US 7,339,408 B2
(45) Date of Patent: *Mar. 4, 2008

(54) GENERATING MULTI-PHASE CLOCK SIGNALS USING HIERARCHICAL DELAYS

(75) Inventor: Seong-hoon Lee, Boise, ID (US)

(73) Assignee: Micron Technology, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/652,939

(22) Filed: Jan. 12, 2007

(65) Prior Publication Data

US 2007/0115036 A1 May 24, 2007

Related U.S. Application Data

(63) Continuation of application No. 11/313,291, filed on Dec. 20, 2005, now Pat. No. 7,173,463, which is a continuation of application No. 10/734,506, filed on Dec. 12, 2003, now Pat. No. 7,009,434.

(51) Int. Cl.
*H03K 7/06* (2006.01)

(52) U.S. Cl. .................. 327/158; 327/159; 327/161; 327/272; 327/278

(58) Field of Classification Search .................. None
See application file for complete search history.

(56) References Cited

U.S. PATENT DOCUMENTS

| | | | |
|---|---|---|---|
| 4,985,639 A | 1/1991 | Renfrow et al. | |
| 5,355,097 A | 10/1994 | Scott et al. | |
| 5,463,337 A | 10/1995 | Leonowich | |
| 5,663,665 A | 9/1997 | Wang et al. | |
| 5,751,665 A | 5/1998 | Tanoi | |
| 5,789,927 A | 8/1998 | Belcher | |
| 5,872,488 A | 2/1999 | Lai | |
| 6,100,736 A | 8/2000 | Wu et al. | |
| 6,194,916 B1 | 2/2001 | Nishimura et al. | |
| 6,194,947 B1 | 2/2001 | Lee et al. | |
| 6,295,328 B1 | 9/2001 | Kim et al. | |
| 6,313,688 B1 | 11/2001 | Lee et al. | |
| 6,326,826 B1 | 12/2001 | Lee et al. | |
| 6,366,148 B1 | 4/2002 | Kim | |
| 6,393,083 B1 | 5/2002 | Beukema | |
| 6,512,408 B2 | 1/2003 | Lee et al. | |

(Continued)

OTHER PUBLICATIONS

Jong-Tae Kwak et al., "A Low Cost High Performance Register-Controlled Digital DLL for 1 Gbps x32 DDR SDRM", The 8th Korean Conference on Semiconductors, Feb. 2001.

(Continued)

*Primary Examiner*—Kenneth B. Wells
*Assistant Examiner*—An T. Luu
(74) *Attorney, Agent, or Firm*—Ropes & Gray LLP; Michael J. Chasan

(57) ABSTRACT

Circuits and methods for generating multi-phase clock signals using digitally-controlled hierarchical delay units (HDs) are provided. A plurality of serially-coupled HDs outputs clock signals that are phase-shifted relative to a reference clock signal. Each HD includes either one or two variable delay lines that provide coarse phase adjustment of an associated input signal. Each HD also includes one or more phase mixers that provide fine phase adjustment of the input signal.

19 Claims, 6 Drawing Sheets

U.S. PATENT DOCUMENTS

| | | |
|---|---|---|
| 6,573,771 B2 | 6/2003 | Lee et al. |
| 6,618,283 B2 | 9/2003 | Lin |
| 6,621,315 B2 | 9/2003 | Heo et al. |
| 6,642,760 B1 | 11/2003 | Alon et al. |
| 6,661,863 B1 | 12/2003 | Toosky |
| 6,762,633 B2 | 7/2004 | Lee |
| 6,768,361 B2 | 7/2004 | Kwak |
| 6,791,381 B2 | 9/2004 | Stubbs et al. |
| 6,812,753 B2 | 11/2004 | Lin |
| 6,952,127 B2 | 10/2005 | Lee |
| 6,956,418 B2 | 10/2005 | Kwak |
| 6,963,235 B2 * | 11/2005 | Lee ............................ 327/158 |
| 6,982,578 B2 | 1/2006 | Lee |
| 6,982,579 B2 | 1/2006 | Lee |
| 7,088,159 B2 * | 8/2006 | Kwak et al. ................. 327/161 |
| 7,173,463 B2 * | 2/2007 | Lee ............................ 327/158 |
| 7,202,721 B2 * | 4/2007 | Jeon ........................... 327/158 |
| 2003/0219088 A1 | 11/2003 | Kwak |
| 2004/0217789 A1 | 11/2004 | Kwak |

OTHER PUBLICATIONS

Ramin Farjad-Rad et al. "A Low-Power Multiplying DLL for Low-Jitter Multigigahertz Clock Generation in Highly Integrated Digital Chips", IEEE Journal of Solid-State Circuits, vol. 37, No. 12, pp. 1804-1812, Dec. 2002.

* cited by examiner

GENERATING MULTI-PHASE CLOCK SIGNALS USING HIERARCHICAL DELAYS

This application is a continuation of U.S. patent application Ser. No. 11/313,291, filed Dec. 20, 2005, now U.S. Pat. No. 7,173,463, which is a continuation of U.S. patent application Ser. No. 10/734,506 (now U.S. Pat. No. 7,009,434), filed Dec. 12, 2003, both of which are hereby incorporated by reference herein in their entirety.

BACKGROUND OF THE INVENTION

This invention relates to circuits and methods for generating multi-phase clock signals. More particularly, this invention relates to circuits and methods for generating multi-phase clock signals using hierarchical delays.

Circuits that generate multi-phase clock signals typically output a plurality of clock signals phase-shifted in equally-spaced increments relative to a reference clock signal. The output clock signals typically have the same frequency as the reference clock signal. For example, a typical circuit may output four clock signals phase-shifted by 90°, 180°, 270° and 360°, respectively, relative to the reference clock signal. Circuits that generate multi-phase clock signals are often used, for example, in electronic systems having complex timing requirements in which multi-function operations are completed during a single reference clock cycle. Multi-phase clock signals are also used in electronic systems in which an operation extends over more than one reference clock cycle.

Conventional circuits generate multi-phase clock signals using analog voltage-controlled delay units (VCDs). The phase shifts (i.e., time delays) generated by the VCDs are adjustable and can be controlled by adjusting the supply voltage. VCDs typically require the use of analog charge pumps and loop filters. It is well-known that analog designs are more difficult to mass produce reliably within stated specifications and are less portable to various process technologies than digital designs.

In view of the foregoing, it would be desirable to provide circuits and methods for generating multi-phase clock signals that rely less on analog components and more on digital components.

SUMMARY OF THE INVENTION

It is an object of this invention to provide circuits and methods for generating multi-phase clock signals that rely less on analog components and more on digital components.

In accordance with this invention, a circuit comprising a plurality of serially-coupled hierarchical delay units (HDs) outputs clock signals phase-shifted relative to a reference clock signal. Each HD includes either one or two variable delay lines (VDLs) that provide coarse phase adjustment of an associated input clock signal. Each HD also includes one or more phase mixers that provides fine phase adjustment of the input clock signal. Advantageously, circuits of the invention do not include analog VCDs, charge pumps or loop filters.

The invention also provides methods of generating multi-phase clock signals using HDs.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention relates to circuits and methods for generating multi-phase clock signals using hierarchical delay units, eliminating the need for analog VCDs, charge pumps and loop filters.

Figure 1:
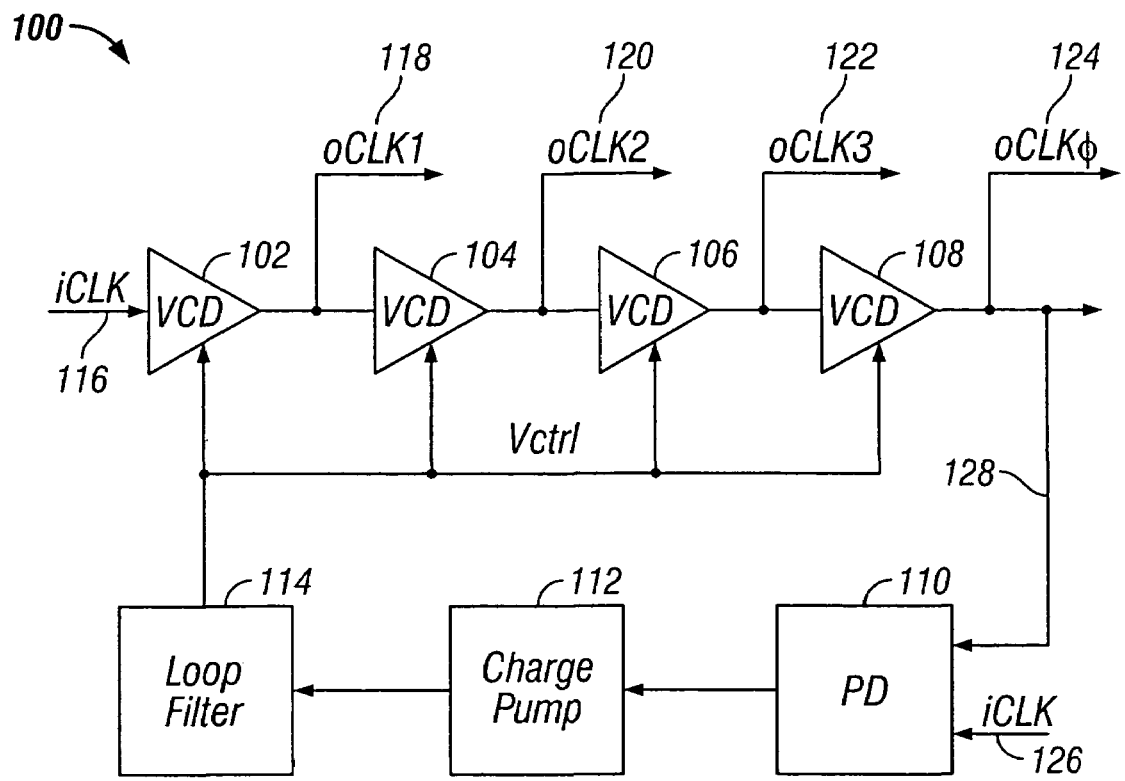
FIG. 1 is a block diagram of a conventional circuit that uses analog voltage-controlled delay units to generate multi-phase clock signals.

FIG. 1 shows a conventional circuit 100 for generating multi-phase clock signals. Circuit 100 includes a plurality of serially-coupled voltage-controlled delay units (VCDs) 102, 104, 106 and 108, phase detector 110, charge pump 112 and loop filter 114. A reference clock signal is input to VCD 102 (i.e., the first VCD in the serially-coupled chain) at input 116. In "locked" mode of operation, each VCD phase shifts (i.e., time delays) the reference clock signal by about (360/M)°, where M is the total number of VCDs in the serially-coupled chain. VCDs 102, 104, 106 and 108 preferably do not change the frequency of the reference clock signal. In this example, circuit 100 has four VCDs 102, 104, 106 and 108 (i.e., M=4)., and each VCD produces a phase shift of about (360/4)°=90°. "Locked" mode of circuit 100 is described in greater detail below. VCDs 102, 104, 106 and 108 output clock signals phase-shifted by about 90°, 180°, 270° and 360° relative to the reference clock signal at outputs 118, 120, 122 and 124, respectively.

Figure 2:
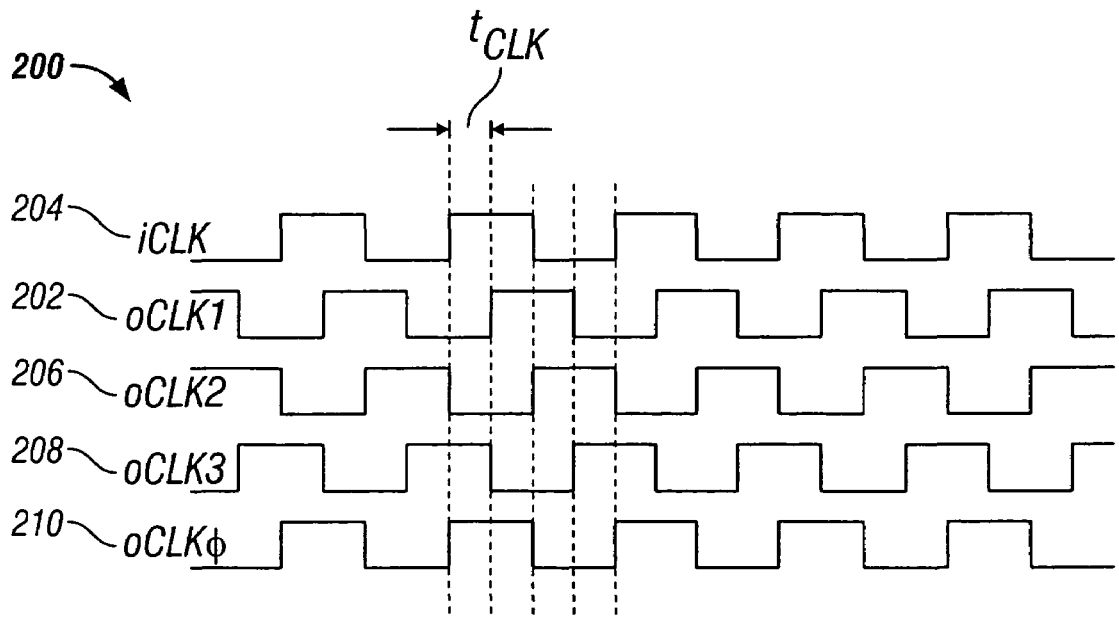
FIG. 2. is a timing diagram showing the relative-phase shifts between the reference and output clock signals of the circuit of FIG. 1 in a "locked", mode of operation.

FIG. 2 is a timing diagram 200 that shows the relative phase shifts between the reference and output clock signals of circuit 100 in "locked" mode. As shown, VCD 102 outputs clock signal 202 that is 90° out of phase with reference clock signal 204, which is. input to circuit 100 at input 116. VCD 104 outputs clock signal 206 that is 180° out of phase with reference clock signal 204. VCD 106 outputs clock signal 208 that is 270° out of phase with reference clock signal 204. VCD 108 outputs clock signal 210 that is 360° (i.e., one full reference clock period) out of phase with reference clock signal 204.

Returning to FIG. 1, circuit 100 maintains the "locked" condition shown in FIG. 2 as follows: Phase detector 110 receives the reference clock signal at input 126. Phase detector 110 receives the clock signal output by VCD 108 (i.e., the last VCD in the serially-coupled chain) at input 128. Phase detector 110 compares the phases of these two signals and provides a signal indicating the result of this comparison to charge pump 112. The desired condition is that these signals are 360° out of phase with one another, as shown in FIG. 2. Charge pump 112 causes either an increase or a decrease in the phase shifts produced by VCDs 102, 104, 106 and 108, depending on which is needed to more closely match the desired condition. In particular, charge pump 112 increases the control voltage ($V_{ctrl}$) supplied to VCDs 102, 104, 106 and 108 when the clock signal output by VCD 108 is phase-shifted greater than 360° relative to the reference clock signal. This causes a decrease in the phase shifts produced by VCDs 102, 104, 106 and 108. Charge pump 112 decreases the control voltage supplied to VCDs 102, 104, 106 and 108 when the clock signal output by VCD 108 is phase-shifted less than 360° relative to the reference clock signal. This causes an increase in the phase shifts produced by VCDs 102, 104, 106 and 108. Loop filter 114 low-pass filters the high frequency components of the signal output by charge pump 112.

Figure 3:
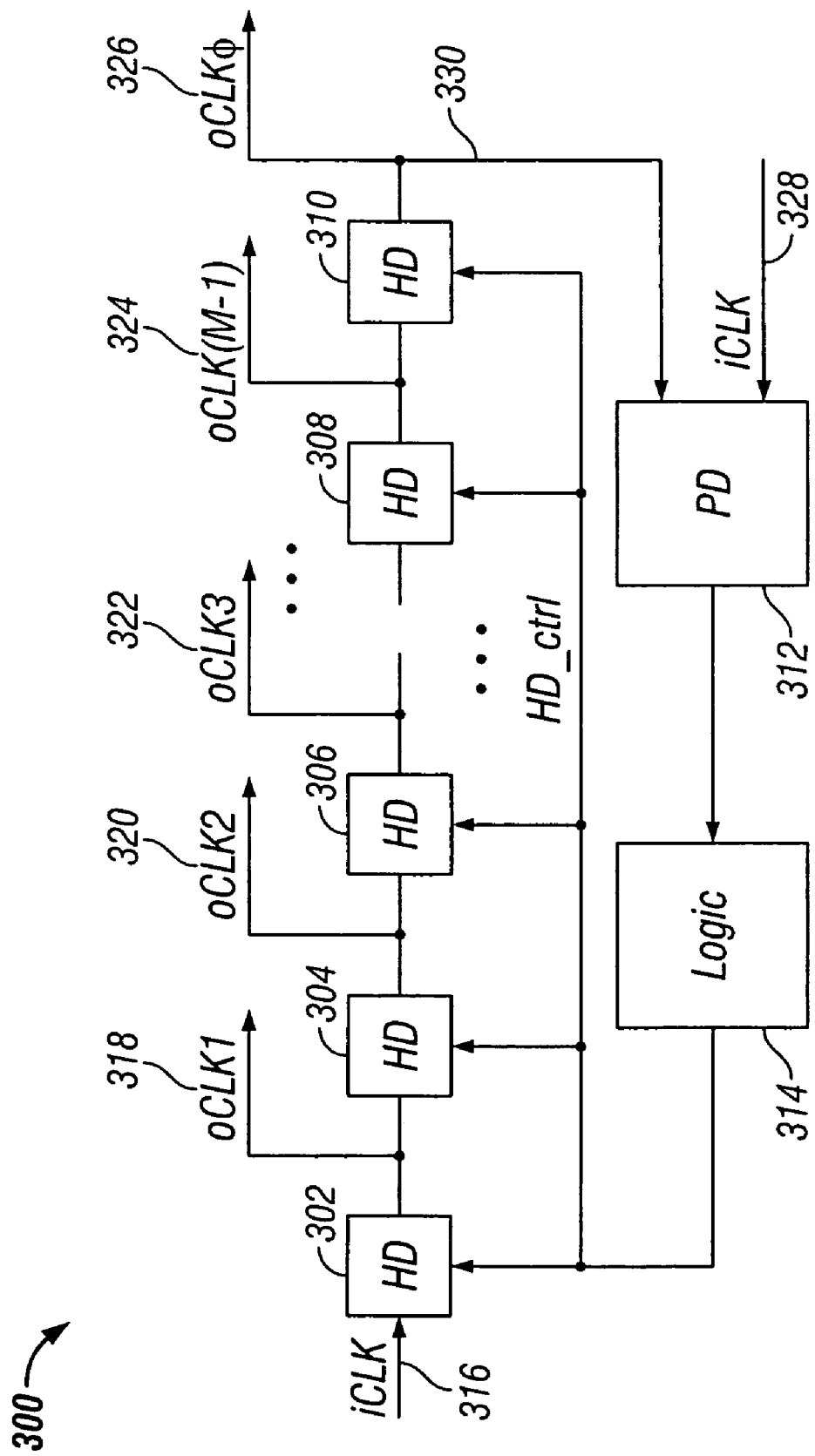
FIG. 3 is a block diagram of a circuit that uses hierarchical delay units to generate multi-phase clock signals in accordance with the invention.

FIG. 3 shows a circuit 300 that can generate multi-phase clock signals in accordance with the invention. Circuit 300 includes a plurality of serially-coupled hierarchical delay units (HDs) 302, 304, 306, 308 and 310, phase detector 312 and logic circuitry 314. A reference clock signal is input to HD 302 (i.e., the first HD in the serially-coupled chain) at input 316. HDs 302, 304, 306, 308 and 310 are preferably substantially identical to one another in order to provide output clock signals phase-shifted in equally-spaced increments relative to the reference clock signal. Each HD phase shifts (i.e., time delays) the reference clock signal by about (360/M)° in "locked" mode of operation, where M is the total number of HDs in the serially-coupled chain. HDs 302, 304, 306, 308 and 310 preferably do not change the frequency of the reference clock signal. "Locked" mode of circuit 300 is described in greater detail below. HDs 302, 304, 306, 308 and 310 output clock signals phase-shifted relative to the reference clock signal at outputs 318, 320, 322, 324 and 326, respectively.

Various numbers of HDs can be included in circuit 300 in order to obtain a desired phase distribution of output clock signals. For example, if four HDs are included in circuit 300 (i.e., M=4), each delay produces a phase shift of about (360/4)°=90°. This results in four output clock signals phase-shifted relative to the reference clock signal by about 90°, 180°, 270° and 360°. These output clock signals may appear similar to the output clock signals shown in FIG. 2. If eight HDs are included in circuit 300 (i.e., M=8), each delay produces a phase shift of about (360/8)°=45°. This results in eight output clock signals phase-shifted relative to the reference clock signal by about 45°, 90°, 135°, 180°, 225°, 270°, 315° and 360°.

Phase detector 312 and logic circuit 314 maintain the "locked" condition of circuit 300. In particular, phase detector 312 receives the reference clock signal at input 328 and the output signal of HD 310 (i.e., the last HD in the serially-coupled chain) at input 330. Phase detector 312 compares the phases of these two signals and provides a signal indicating the result of this comparison to logic circuit 314. The desired condition is often that these signals be 360° (i.e., one full reference clock period) out of phase with one another. Other phase relationships are of course possible. Logic circuit 314 causes either an increase or a decrease in the phase-shifts of HDs 302, 304, 306, 308 and 310, depending on which is needed to more closely match the desired condition. Logic circuit 314 may include various numbers and configurations of logic gates, as needed to provide the digital signals required for controlling the HDs of circuit 300. For example, substantially identical HDs that output clock signals is phase-shifted in equally-spaced increments relative to the reference clock signal can be controlled by the same digital signals. The design of a suitable logic circuit 314 should be apparent to one of ordinary skill in the art in view of the following description of HDs.

A hierarchical delay unit (HD) in accordance with the invention provides multiple stages of phase adjustment. In particular, an HD includes a first stage in which either-one or two variable delay lines (VDLs) provide "coarse" phase adjustment of an associated input clock signal. The HD also includes one or more stages of phase mixers that provide "fine" phase adjustment relative to the input clock signal.

Figure 4:
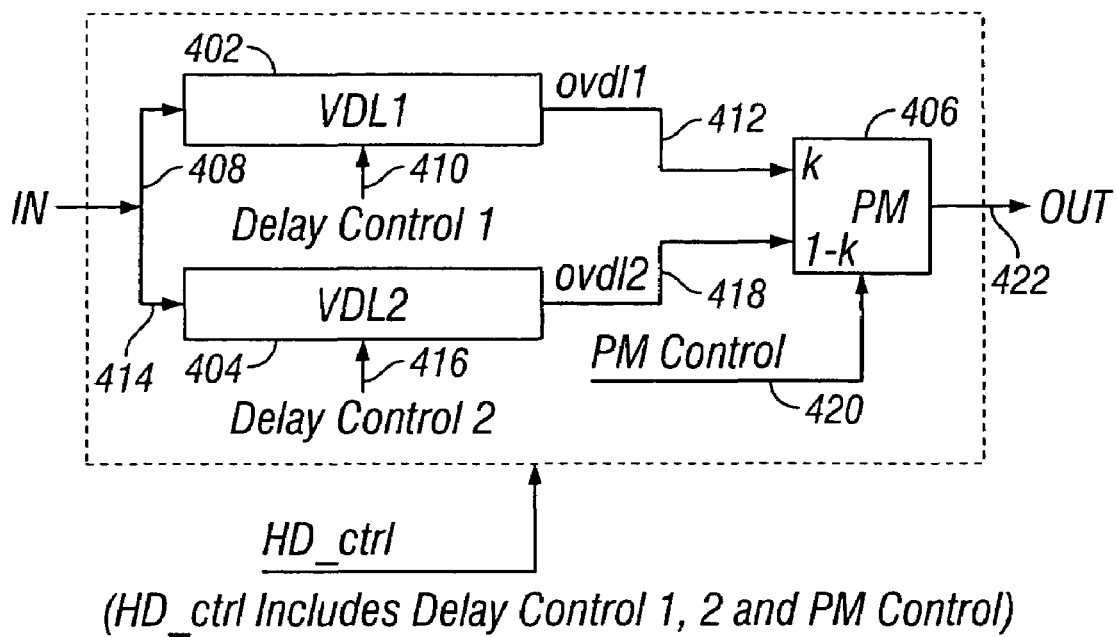
FIGS. 4-6 are block diagrams of various embodiments of the hierarchical delay units of FIG. 3. in accordance with the invention.

FIG. 4 shows an embodiment of an HD having two stages of phase adjustment in accordance with the invention. HD 400 includes VDLs 402 and 404 and phase mixer 406. In the first stage, VDL 402 receives a clock signal at input 408 and a control signal at input 410, and outputs a signal phase-shifted relative to the input clock signal by a first phase ($\phi_1$) at output 412. VDL 404 receives the input clock signal at input 414 and a control signal at input 416, and outputs a signal phase-shifted relative to the input clock signal by a second phase ($\phi_2$) at output 418. In the second stage, phase mixer 406 receives the phase-shifted signals from VDLs 402 and 404 and also receives a control signal at input 420. Phase mixer 406 outputs a clock signal having an overall phase shift ($\phi_{out}$) relative to the input clock signal at output 422. The overall phase shift ($\phi_{out}$) can be one of N possible phase shifts, evenly spaced apart, between and including $\phi_1$ and $\phi_2$, where N is characteristic of phase mixer 406 and can be any reasonable number (e.g., 5 or 10). The Nth phase shift of phase mixer 406 that most closely matches the desired phase shift of HD 400 is preferably selected.

The overall phase shift $\phi_{out}$ of the clock signal output by HD 400 at output 422 can be represented by the following equation:

$$\phi_{out} = \phi_1 * (1-K) + \phi_2 * K$$

where $K = c/(N-1)$ for $c = 0, 1, \ldots N-1$

Variable K is a weighting factor of phase mixer 406 that can be one of N possible values and that determines how closely the output phase shift $\phi_{out}$ matches either of the phase shifts $\phi_1$ and $\phi_2$. This equation is for an ideal phase mixer having zero propagation delay. For K equal to zero, phase mixer 406 outputs a clock signal phase-shifted by $\phi_1$. For K equal to (N-1), phase mixer 406 outputs a clock signal phase-shifted by $\phi_2$. For all other values of c, phase mixer 406 outputs a clock signal phase-shifted between $\phi_1$ and $\phi_2$.

VDLs 402 and 404 each include delay units that phase shift the clock signal received at respective inputs 408 and 414 by $\phi_1$ and $\phi_2$, respectively. The delay units of VDLs 402 and 404 may be either analog or digital that can be digitally controlled by logic circuit 314. The number of delay units in a VDL indicates the number of phase shifts (i.e., $\phi$s) that the VDL can generate. For example, a VDL having five delay units can phase shift its input signal by one of five phases (e.g., $\phi+\theta 2\theta, 3\theta, 4\theta$ or $5\theta$). Logic circuit 314 sets control signals 410 and 416 of VDLs 410 and 416 such that one of $\phi_1$ and $\phi_2$ is greater than or equal to the overall phase shift of HD 400, and the other is less than or equal to the overall phase shift. For example, if HD 400 generates an overall phase-shift of 90° relative to the input clock signal, logic circuit 314 sets control signals 410 and 416 such that one of $\phi_1$ and $\phi_2$ is greater than or equal to 90°, and the other is less than or equal to 90°.

Control signals 410 and 416 of VDLs 402 and 404 are preferably set such that $\phi_1$ and $\phi_2$ differ by only one unit phase shift (i.e., $\phi_2 - \phi_1 = \theta$), which is the minimum phase adjustment step size that can be provided by VDLs 402 and 404.

In another embodiment, HD 400 may include only a single VDL to generate both $\phi_1$ and $\phi_2$ having a phase difference of one unit phase shift. In particular, the output of a single VDL could be split into two outputs, one output providing $\phi_1$ and the other output feeding into an additional delay unit to provide $\phi_2$.

The minimum phase adjustment step size $\theta$ provided by VDLs 402 and 404 can be represented by the following equation:

$$\theta = (tUD/Tref) * 360°$$

where tUD is a time delay characteristic of a single delay unit of VDLs 402 and 404 (e.g., 100 or 200 picoseconds (ps)) and Tref is the period of the clock signal input to HD 400. For example, for an input signal having Tref=10000 ps (i.e., frequency of 100 MHz), and a unit delay having tUD=100 ps, the minimum phase adjustment step size that can be provided by VDLs 402 and 404 is $\theta=(100/10000)*360°=3.6°$.

Phase mixer 406 provides for finer phase adjustment of the output signal relative to the clock input signal. In particular, because phase mixer 406 outputs a clock signal that can have one of N possible phase shifts, evenly spaced apart, between and including $\phi_1$ and $\phi_2$, it follows that phase mixer 406 reduces the minimum phase adjustment step size that can be provided by HD 400 to $\theta/N$. For example, keeping with the above example where the minimum step size provided by VDLs is 3.6°, a phase mixer 406 with N=10 would reduce the minimum phase adjustment step size that can be provided by HD 400 to 3.6°/N=0.36°.

Figure 5:
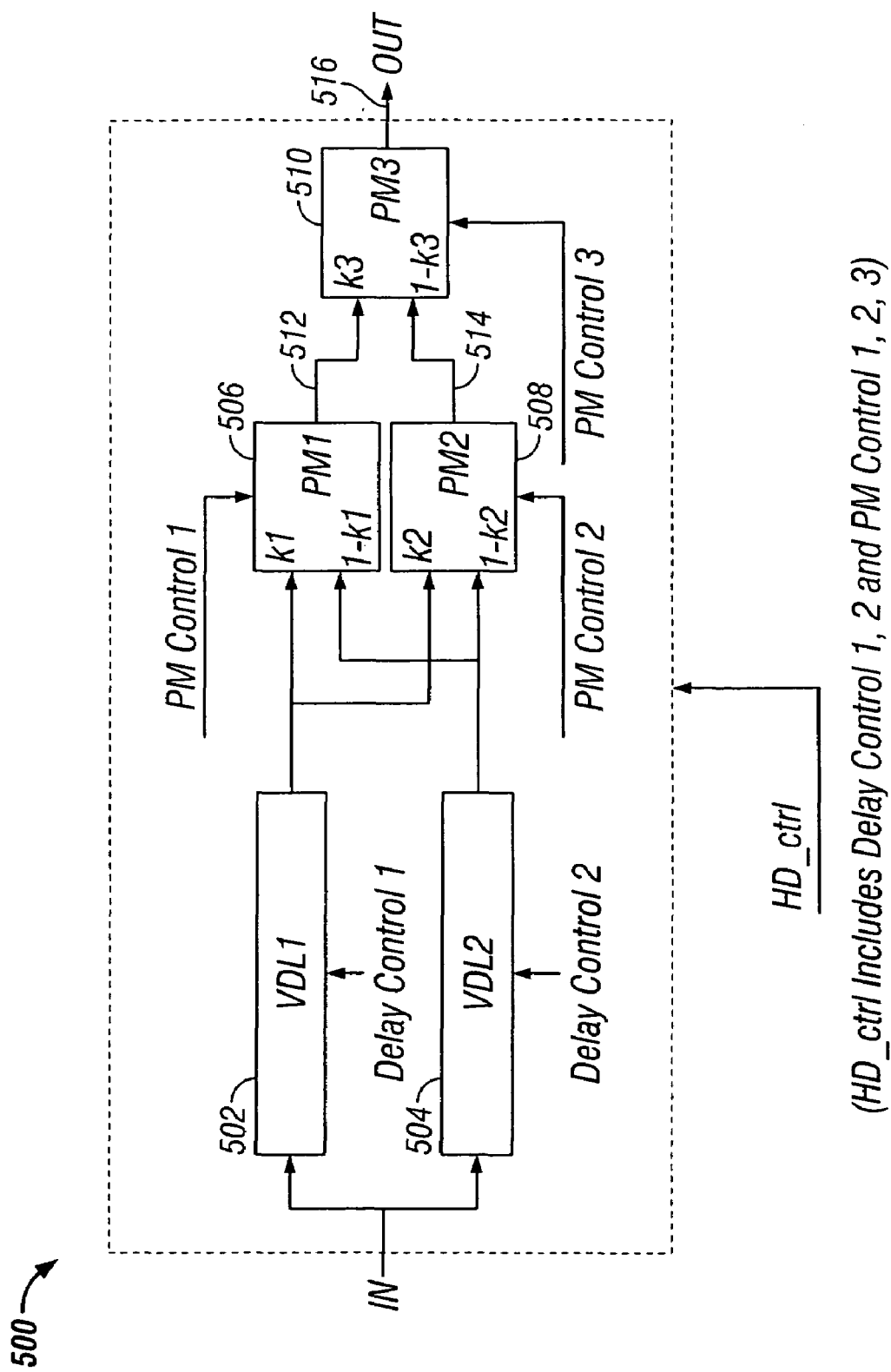

In accordance with the invention, an HD may include multiple stages of phase mixers to allow for increasingly finer phase adjustment. FIG. 5 shows another embodiment of an HD in accordance with the invention. HD 500 has three stages of phase adjustment and includes VDLs 502 and 504 and phase mixers 506, 508 and 510. VDLs 502 and 504 form a single stage of "coarse" phase adjustment that may be the same as that of HD 400. Phase mixers 506 and 508 form a first stage of "fine" phase adjustment, and phase mixer 510 forms a second stage of "finer" phase adjustment.

In particular, each of phase mixers 506 and 508 receives signals from VDLs 502 and 504 phase-shifted by $\phi_1$ and $\phi_2$. Phase mixers 506 and 508 generate respective output signals 512 and 514 having $N_1$ possible phase shifts between and including $\phi_1$ and $\phi_2$. Phase mixer 510 receives signals 512 and 514, and outputs a clock signal at output 516 having an overall phase shift ($\phi_{out}$) that can be represented by the following equation:

$$\phi_{out} = \phi_1 * (1-K) + \phi_2 * K$$

where $K = c/(N_1 * N_2 - 1)$ for $c = 0, 1, \ldots N_1 * N_2 - 1$ and $N_2$ is the number of possible phase shifts between and including the phase shifts of signals 512 and 514 that can be generated by phase mixer 510. The above equation is for phase mixers 506, 508 and 510 ideally having zero propagation delay. Together, the two stages of phase mixers provide for $N_1 * N_2$ possible phase shifts, evenly spaced apart, between and including $\phi_1$ and $\phi_2$. Therefore, the two stages of phase mixers reduce the minimum phase adjustment step size from $\theta$ (i.e., the minimum step size that can be provided by VDLs 402 and 404) to $\theta/N_1 * N_2$.

Figure 6:
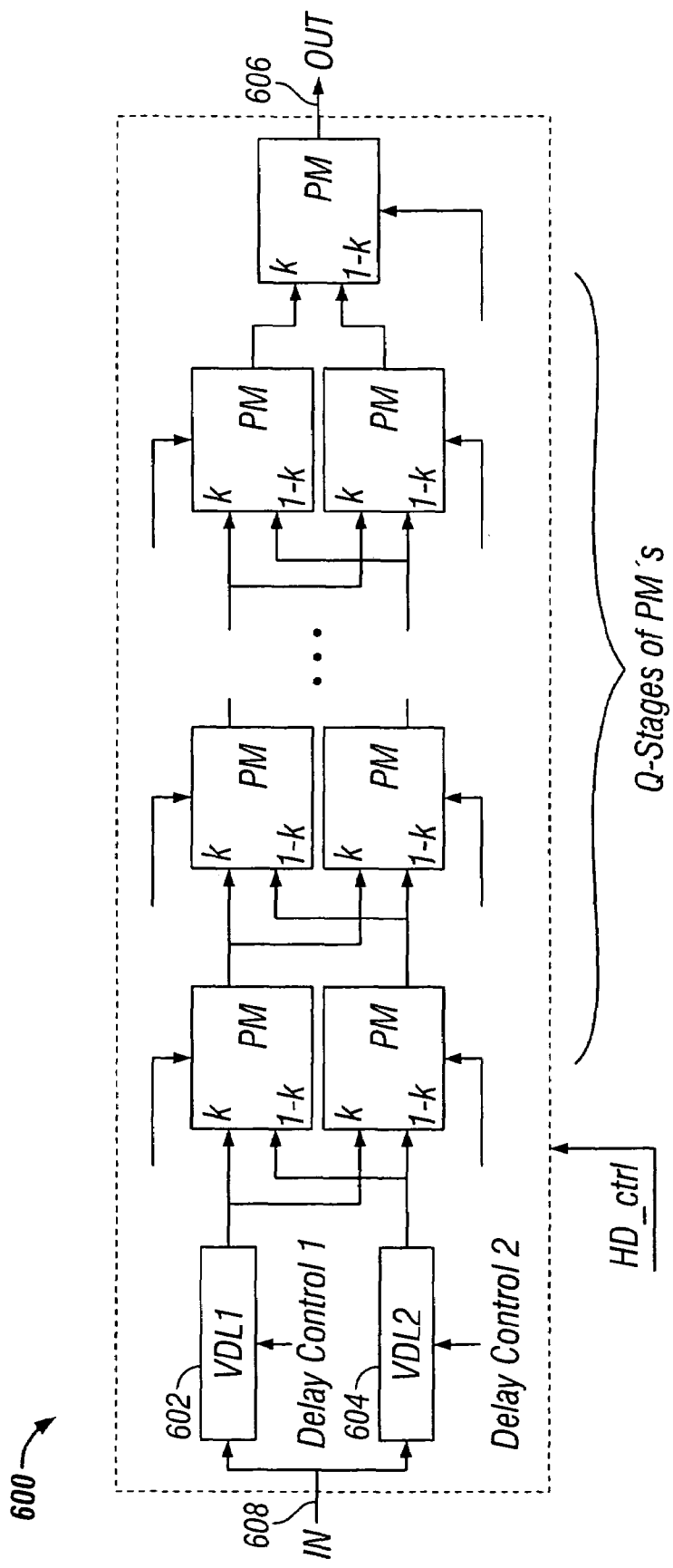

FIG. 6 shows a generalized embodiment of an HD having multiple stages of phase adjustment in accordance with the invention. HD 600 includes a single stage of "coarse" phase adjustment (formed by VDLs 602 and 604) and Q of stages of "fine" phase adjustment (formed by a plurality of phase mixers). HD 600 outputs a clock signal at output 606 phase-shifted relative to the input clock signal received at input 608. The overall phase shift ($\phi_{out}$) of the clock signal at output 606 can be represented by the following equation:

$$\phi_{out} = \phi_1 * (1-K) + \phi_2 * K$$

where $K = c/(N_1 * N_2 * \ldots * N_{Q-1} * N_Q - 1)$ for $c = 0, 1, \ldots (N_1 * N_2 * \ldots * N_{Q-1} * N_Q - 1)$ and $N_Q$ is the number of possible phase shifts that can be produced by the Qth stage of phase mixers. The above equation is for ideal phase mixers having zero propagation delay. Together, the Q stages of "fine" phase adjustment provide $(N_1 * N_2 * \ldots N_{Q-1} * N_Q)$ possible phase shifts, evenly spaced apart, between and including $\phi_1$ and $\phi_2$ generated by VDLs 602 and 604, respectively. Thus, Q stages of phase mixers reduce the minimum phase adjustment step size that can be provided by HD 600 from $\theta$ (i.e., the minimum step size that can be provided by VDLs 402 and 404) to $\theta/(N_1 * N_2 * \ldots N_{Q-1} * N_Q)$.

FIGS. 4-6 have been described herein for clarity primarily in the context of using the control signals from logic circuit 314 to set respective phase mixers such that a signal having an intermediate phase is generated. Note that some or all of the phase mixers can be controlled to output a signal having the same phase as one of the input signals, if such a phase is desired. For example, in some applications, an input signal may need each stage of "fine" phase adjustment formed by various phase mixers in order to generate an output signal having a desired phase, while in other applications, an input signal may need only some of the stages of phase mixers in order to generate an output signal having a desired phase. Alternatively, if all the stages of phase mixers are not needed to generate a desired output signal, rather than sending the signals through each stage, the output signal can be routed directly to the output from the last stage needed, thus bypassing the remaining stages.

Figure 7:
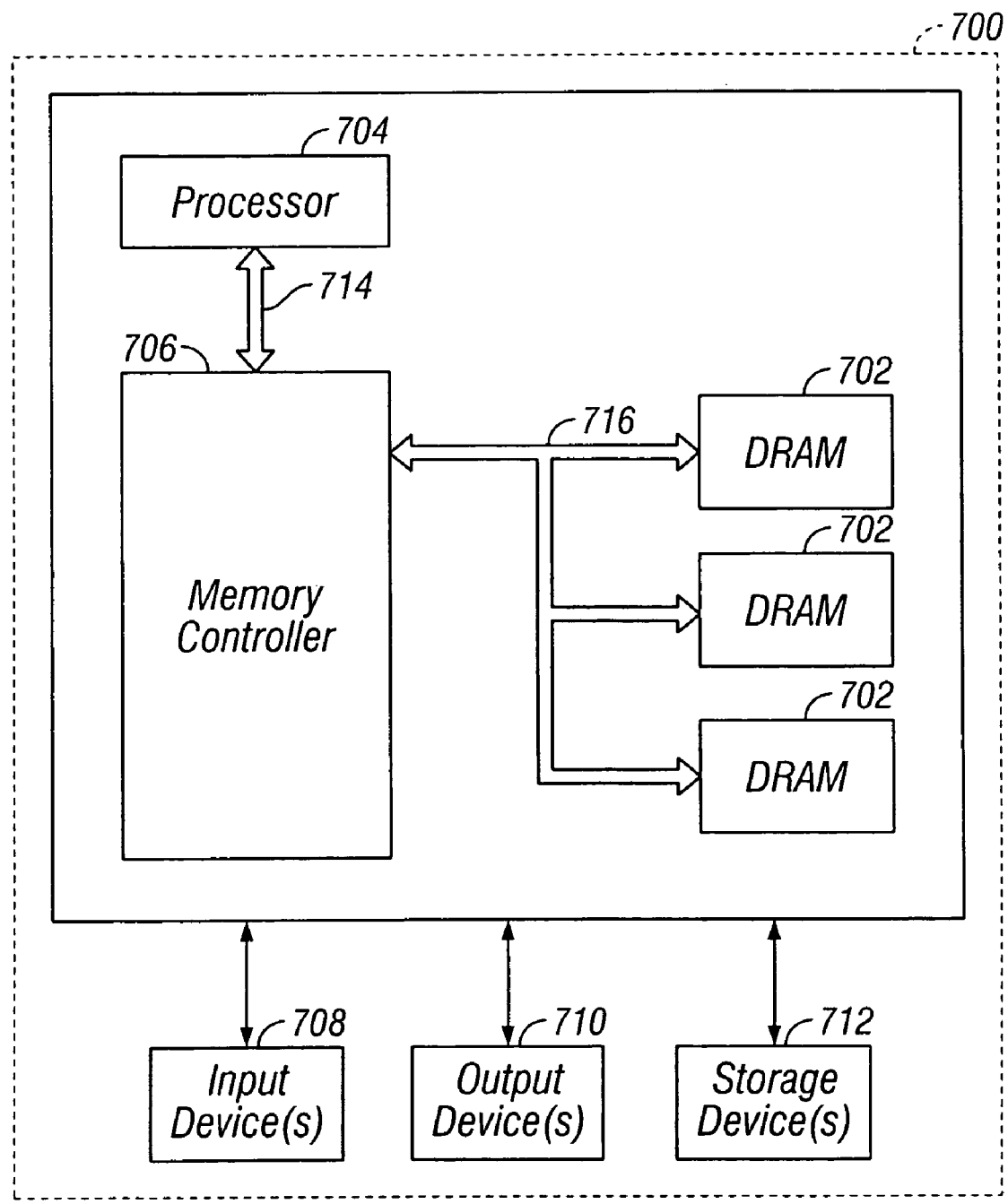
FIG. 7 is a block diagram of a system that incorporates the invention.

FIG. 7 shows a system 700 that incorporates the invention. System 700 includes a plurality of DRAM chips 702, a processor 704, a memory controller 706, input devices 708, output devices 710, and optional storage devices 712. DRAM chips 702 include an array of memory cells. One or more DRAM chips 702 also include one or more circuits of the invention to generates multi-phase clock signals using hierarchical delays. The circuits of the invention may, for example, be used to synchronize data output by the DRAMs with an external clock signal (e.g., synchronous DRAM (SDRAM)). Data and control signals are transferred between processor 704 and memory controller 706 via bus 714. Similarly, data and control signals are transferred between memory controller 706 and DRAM chips 702 via bus 716. Input devices 708 can include, for example, a keyboard, a mouse, a touch-pad display screen, or any other appropriate device that allows a user to enter information into system 700. Output devices 710 can include, for example, a video display unit, a printer, or any other appropriate device capable of providing output data to a user. Note that input devices 708 and output devices 710 can alternatively be a single input/output device. Storage devices 712 can include, for example, one or more disk or tape drives.

Thus it is seen that circuits and methods for generating multi-phase clock signals using hierarchical delays are provided. One skilled in the art will appreciate that the invention can be practiced by other than the described embodi-

I claim:

1. A circuit for receiving a reference clock signal and outputting clock signals having different phases corresponding to said reference clock signal, said circuit comprising:
   a plurality of serially-coupled delay units comprising a first delay unit operative to receive said reference clock signal, said plurality of serially-coupled delay units operative to output a plurality of clock signals phase-shifted differently relative to said reference clock signal, wherein each of said plurality of serially-coupled delay units comprise two parallel delay lines and at least one phase mixer, and wherein each of said plurality of serially-coupled delay units comprises at least three phase mixers;
   a phase detector operative to output a signal indicating a phase difference between said reference clock signal and one of said plurality of clock signals output by said plurality of serially-coupled delay units; and
   logic circuitry operative to control a phase shift of said plurality of serially-coupled delay units based on said output of said phase detector.

2. The circuit of claim 1 wherein said two parallel delay lines unit are operative to output a first signal and a second, said first and second signals having different phases, and wherein said at least one phase mixer is operative to receive said first and said second signals and to output a third signal having a third phase.

3. The circuit of claim 1 wherein each of said plurality of serially-coupled delay units provide at least two stages of increasingly finer variable phase adjustment.

4. The circuit of claim 3 wherein each of said plurality of serially-coupled delay units comprises at least two additional phase mixers for each additional stage of increasingly finer variable phase adjustment.

5. The circuit of claim 1 wherein said plurality of serially-coupled delay units are controlled by at least three digital signals.

6. The circuit of claim 1 wherein said two parallel delay lines provide coarse phase shift adjustment.

7. The circuit of claim 1 wherein a first phase mixer provide phase shift adjustment finer than said two parallel delay lines.

8. The circuit of claim 1 wherein a second and third phase mixer provide phase adjustment finer than said first phase mixer.

9. A circuit for receiving a reference clock signal and outputting clock signals having different phases corresponding to said reference clock signal, said circuit comprising:
   a plurality of serially-coupled delay units comprising a first delay unit operative to receive said reference clock signal, said plurality of serially-coupled delay units operative to output a plurality of clock signals phase-shifted differently relative to said reference clock signal, said serially-coupled delay units adjustable by at least three digital control signals;
   a phase detector operative to output a signal indicating a phase difference between said reference clock signal and a clock signal output by said plurality of serially-coupled delay units; and
   logic circuitry operative to output said at least three digital control signals to adjust a phase shift performed by said plurality of serially-coupled delay units based on said output of said phase detector.

10. The circuit of claim 9 wherein a first and a second control signals are operative to coarsely adjust the phase shift performed by said plurality of serially-coupled delay units.

11. The circuit of claim 10 wherein a third control signal is operative to adjust finely said coarsely adjusted phase shift performed by said plurality of serially-coupled delay units.

12. The circuit of claim 9 further comprising at least five control signals, wherein:
   a first and a second control signals are operative to coarsely adjust the phase shift performed by said plurality of serially-coupled delay units;
   a third and a fourth control signals are operative to adjust finely said coarsely adjusted phase shift; and
   a fifth control signal is operative to adjust more finely said finely adjusted phase shift performed by said plurality of serially-coupled delay units.

13. The circuit of claim 9 wherein each of said plurality of serially-coupled delay units comprise at least 2N−1 control signals, where N is the number of stages of increasingly finer variable phase adjustment.

14. An apparatus for outputting multi-phase clock signals corresponding to a reference clock signal, said apparatus comprising:
   means for receiving said reference clock signal;
   means for outputting a plurality of clock signals each phase-shifted differently relative to said reference clock signal;
   means for measuring a phase difference between said reference clock signal and one of said plurality of clock signals;
   means for adjusting a phase shift of said plurality of clock signals in response to a measured phase difference, wherein said means for adjusting comprises means for adjusting said phase using at least three digital control signals.

15. The apparatus of claim 14 wherein a first and a second control signals are operative to coarsely adjust the phase shift performed by said plurality of serially-coupled delay units.

16. The apparatus of claim 15 wherein a third control signal is operative to adjust finely said coarsely adjusted phase shift performed by said plurality of serially-coupled delay units.

17. The apparatus of claim 14 further comprising at least five control signals, wherein:
   a first and a second control signals are operative to coarsely adjust the phase shift performed by said plurality of serially-coupled delay units;
   a third and a fourth control signals are operative to adjust finely said coarsely adjusted phase shift; and
   a fifth control signal is operative to adjust more finely said finely adjusted phase shift performed by said plurality of serially-coupled delay units.

18. The apparatus of claim 14 wherein each of said plurality of serially-coupled delay units comprise at least 2N−1 control signals, where N is the number of stages of increasingly finer variable phase adjustment.

19. The apparatus of claim 14 further comprising:
   means for adjusting coarsely phase shifts of said plurality of clock signals in response to a measured phase shift;
   means for adjusting finely said coarsely adjusted phase shifts of said plurality of clock signals in response to a measured phase shift; and
   means for adjusting more finely said finely adjusted phase shifts of said plurality of clock signals in response to a measured phase shift.

* * * * *

UNITED STATES PATENT AND TRADEMARK OFFICE
CERTIFICATE OF CORRECTION

PATENT NO.       : 7,339,408 B2  Page 1 of 1
APPLICATION NO.  : 11/652939
DATED            : March 4, 2008
INVENTOR(S)      : Lee It is certified that error appears in the above-identified patent and that said Letters Patent is hereby corrected as shown below:

On the face page, in field (73), in "Assignee", in column 1, line 1, after "Technology," insert -- Inc., --.

Signed and Sealed this

Seventeenth Day of June, 2008

JON W. DUDAS
*Director of the United States Patent and Trademark Office*